United States Patent
Saino

(10) Patent No.: US 8,735,230 B2
(45) Date of Patent: May 27, 2014

(54) METHOD FOR MANUFACTURING A SEMICONDUCTOR DEVICE INCLUDING AN IMPURITY-DOPED SILICON FILM

(76) Inventor: Kanta Saino, Tokyo (JP)

( * ) Notice: Subject to any disclaimer, the term of this patent is extended or adjusted under 35 U.S.C. 154(b) by 1532 days.

(21) Appl. No.: 11/765,116

(22) Filed: Jun. 19, 2007

(65) Prior Publication Data
US 2007/0290259 A1 Dec. 20, 2007

(30) Foreign Application Priority Data
Jun. 20, 2006 (JP) .................... 2006-169766

(51) Int. Cl.
*H01L 21/00* (2006.01)
*H01L 21/338* (2006.01)
*H01L 21/337* (2006.01)

(52) U.S. Cl.
USPC ............... 438/157; 138/176; 138/195

(58) Field of Classification Search
USPC ............ 438/259, 270, 157, 176, 195
See application file for complete search history.

(56) References Cited

U.S. PATENT DOCUMENTS

| | | | | |
|---|---|---|---|---|
| 5,283,201 A * | 2/1994 | Tsang et al. | ............ | 438/138 |
| 5,907,775 A * | 5/1999 | Tseng | ............ | 438/261 |
| 6,087,222 A * | 7/2000 | Jung Lin et al. | ............ | 438/259 |
| 6,124,167 A * | 9/2000 | Kao et al. | ............ | 438/257 |
| 6,303,437 B1 * | 10/2001 | Liu | ............ | 438/257 |
| 7,045,456 B2 * | 5/2006 | Murto et al. | ............ | 438/649 |
| 7,645,687 B2 * | 1/2010 | Chong et al. | ............ | 438/473 |
| 2004/0124461 A1 * | 7/2004 | Gajda | ............ | 257/330 |
| 2005/0062108 A1 * | 3/2005 | Nagai | ............ | 257/388 |
| 2005/0133836 A1 * | 6/2005 | Seo et al. | ............ | 257/288 |
| 2005/0153494 A1 * | 7/2005 | Ku et al. | ............ | 438/197 |
| 2005/0236665 A1 * | 10/2005 | Darwish et al. | ............ | 257/330 |
| 2005/0277252 A1 * | 12/2005 | You et al. | ............ | 438/257 |
| 2006/0099812 A1 * | 5/2006 | Krull | ............ | 438/690 |
| 2006/0183296 A1 * | 8/2006 | Yoo et al. | ............ | 438/424 |
| 2006/0197143 A1 * | 9/2006 | Forbes | ............ | 257/315 |
| 2006/0220141 A1 * | 10/2006 | Besser | ............ | 257/371 |
| 2006/0234433 A1 * | 10/2006 | Luan et al. | ............ | 438/197 |
| 2007/0007571 A1 * | 1/2007 | Lindsay et al. | ............ | 257/306 |
| 2007/0063270 A1 * | 3/2007 | Cho et al. | ............ | 257/330 |
| 2007/0238249 A1 * | 10/2007 | Swift et al. | ............ | 438/259 |
| 2008/0194092 A1 * | 8/2008 | Kaushik | ............ | 438/591 |
| 2008/0203463 A1 * | 8/2008 | Van Schaijk et al. | ............ | 257/320 |

FOREIGN PATENT DOCUMENTS

| | | |
|---|---|---|
| JP | 4-114476 | 4/1992 |
| JP | 6-97082 | 4/1994 |
| JP | 10-12744 | 1/1998 |
| JP | 2000-503167 | 3/2000 |
| JP | 2000-183339 | 6/2000 |
| JP | 2001-24185 | 1/2001 |
| JP | 2002-299242 | 10/2002 |
| JP | 2005-039270 | 2/2005 |

OTHER PUBLICATIONS

Kim et al., "The Breakthrough in data retention time of DRAM using Recess-Channel-Array Transistor (RCAT) for 88nm feature size and beyond", Symposium on VLSI Technology pp. 11-12, 2003.

* cited by examiner

Primary Examiner — James Mitchell

(57) ABSTRACT

A process for manufacturing a semiconductor device consecutively includes forming a recess in the surface region of a silicon substrate, forming a gate insulation film on the surface of the recess, depositing a silicon electrode film including an oxygen-mixed layer extending parallel to the surface of the recess, injecting impurities into silicon the electrode film 17, and heat-treating the silicon electrode film to diffuse impurities.

9 Claims, 4 Drawing Sheets

METHOD FOR MANUFACTURING A SEMICONDUCTOR DEVICE INCLUDING AN IMPURITY-DOPED SILICON FILM

This application is based upon and claims the benefit of priority from Japanese patent application No. 2006-169766, the disclosure of which is incorporated herein in its entirety by reference.

BACKGROUND OF THE INVENTION (a) Field of the Invention

The present invention relates to a method for manufacturing a semiconductor device and, more particularly, to a method for manufacturing a semiconductor device including an impurity-doped silicon film.

(b) Description of the Related Art

A DRAM (dynamic random access memory) device generally includes a memory cell array area wherein a plurality of memory cells are arranged in a two-dimensional array, and a peripheral circuit area wherein a peripheral circuit for driving the memory cells is disposed. The memory cells each include a MOSFET formed on a surface region of a silicon substrate, and a capacitor connected to the MOSFET for storing therein electric charge or data. In general, the electric charge stored in the capacitor gradually reduces due to the junction leakage current as the time elapses. Thus, the DRAM device operates refreshing the data by restoring the electric charge in the capacitor after reading the stored electric charge within the time interval specified for read out of the electric charge.

In the DRAM device installed in an electronic equipment, especially in a portable electronic equipment it is ever desired to reduce electronic equipment and to improve the data retention capability of the memory cells for increasing the time interval between refreshing operations.

A literature presented on "Symposium on VLSI Technology", pp 11-12, 2003 describes a RCAT (recess-channel-array transistor) or recessed-channel MOSFET for improving the data retention capability of the memory cells including the MOSFET. The recessed-channel MOSFET is a specific MOSFET including a gate electrode made of silicon, which is received in a recess formed in a surface region of the silicon substrate.

In operation of the recessed-channel MOSFET, a U-character channel is formed along the surface of the recess, whereby a larger channel length is obtained even in a semiconductor device manufactured with a smaller design rule. The recessed-channel MOSFET achieves a specific threshold voltage for a channel having an impurity concentration lower than that for the channel of a planar MOSFET. This allows the recessed-channel MOSFET to have a lower electric field across the p-n junction, thereby reducing the junction leakage current to improve the data retention capability of the memory cells.

In a process for manufacturing the recessed-channel MOSFET, the recess is formed in the surface region of the silicon substrate, followed by deposition of a silicon electrode film on the silicon substrate including the internal of the recess via the gate insulation film. The silicon electrode film is doped with a dopant or impurities by ion implantation and then subjected to pattering thereof to form gate electrodes. A heat treatment is then conducted to diffuse the dopant within the gate electrodes for activation of the dopant thereby obtaining the gate electrodes having a higher electric conductivity.

On the other hand, it is desired to allow MOSFETs formed in the peripheral circuit area to have a smaller channel length for achieving a higher operational speed. Thus, planar cell array transistors (planar MOSFETs) are preferably used as the MOSFETs in the peripheral circuit area.

The inventor analyzed the process for manufacturing the recessed-channel MOSFETs in the memory cell array area and planar MOSFETs in the peripheral circuit area. In order for improving the throughput of the process for the DRAM device, it is preferable to conduct ion-implantation of the silicon electrode film in the recessed-channel MOSFETs and the silicon electrode film in the planar MOSFETs in the peripheral circuit area in a single step, if both the silicon electrode films includes specific conductivity-type impurities, i.e., p-type or n-type dopant. However, the single implantation step has a problem in that the acceleration energy of the ion-implantation of the silicon electrode film in the peripheral circuit area should be adapted to a smaller thickness of the silicon electrode film therein, although the silicon electrode film of the recessed-channel MOSFETs have a larger thickness. The smaller acceleration energy adapted to a smaller thickness of the silicon electrode film cannot allow the impurities to be well diffused within the depth of the bottom surface of the silicon electrode film in the memory cell array area, as schematically shown in FIG. 4, which depicts a conventional technique achieving the single ion-implantation step.

The lower impurity concentration near the bottom of the silicon electrode film 17 causes depletion of the gate electrodes during operation of the recessed-channel MOSFETs, thereby reducing the ON-current of the MOSFETs and degrades the operational speed of the DRAM device.

SUMMARY OF THE INVENTION

In view of the above problems in the conventional technique, it is an object of the present invention to provide a method for manufacturing a semiconductor device having an impurity-doped silicon film, which is capable of implanting a silicon film with a sufficient dosage near the bottom thereof. It is another object of the present invention to provide such a semiconductor device.

The present invention provides a method for manufacturing a semiconductor device including a recessed-channel MOSFET, including: forming a recess in a surface region of a semiconductor substrate; forming a gate insulation film on a surface of the semiconductor substrate; forming a silicon electrode film on the gate insulation film, the silicon electrode film including therein an oxygen-mixed layer substantially parallel to a surface of the recess; injecting impurities in the silicon electrode film; and heat-treating the silicon electrode film to diffuse the impurities, in the order as recited above.

The present invention also provides a semiconductor device including: a semiconductor substrate including a recess formed in a surface region of the semiconductor substrate; and an impurity-doped silicon film formed in the recess, wherein the impurity-doped silicon film includes a crystal grain interface extending substantially parallel to a surface of the recess.

The term "crystal grain interface" as used in this text means a boundary between crystal grains in a polycrystalline substance.

The above and other objects, features and advantages of the present invention will be more apparent from the following description, referring to the accompanying drawings.

PREFERRED EMBODIMENT OF THE INVENTION

Figure 1:
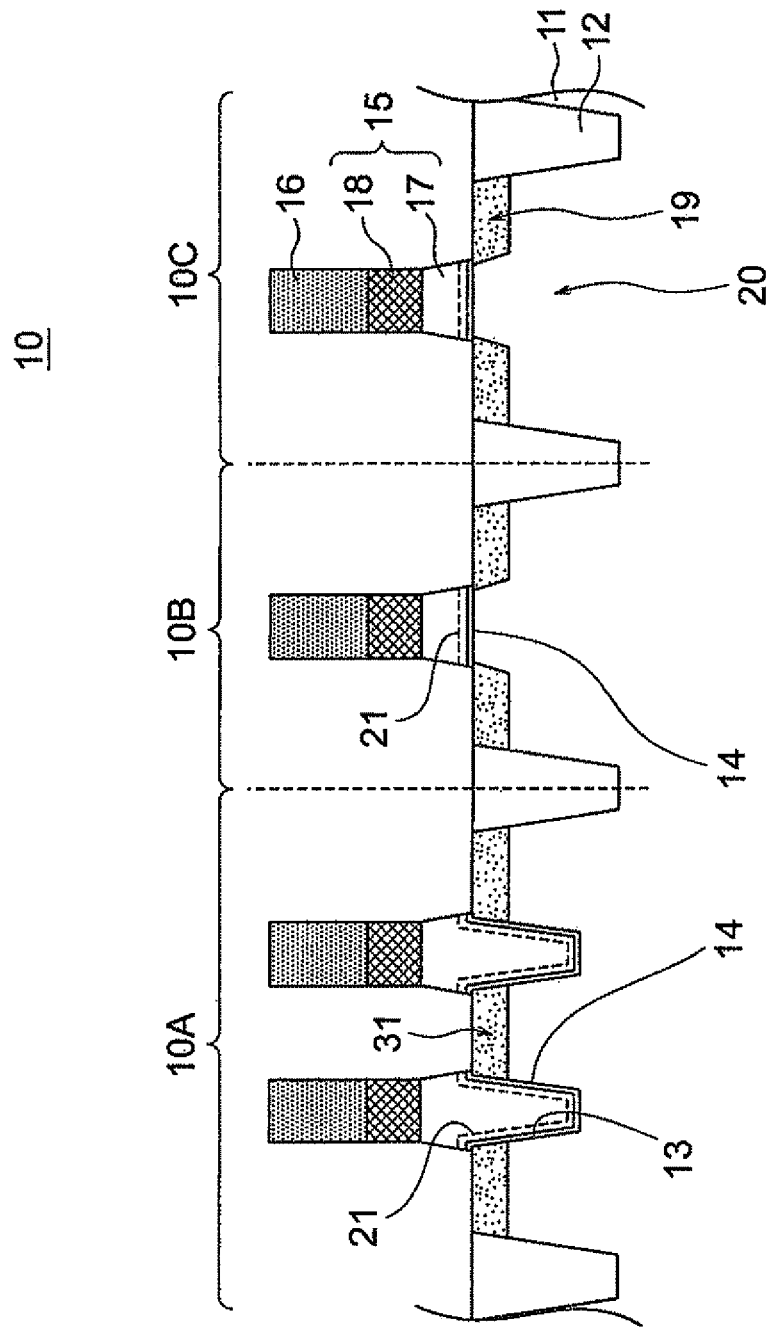
FIG. 1 is a sectional view of a semiconductor device according to an exemplary embodiment of the present invention.

Now, exemplary embodiments of the present invention will be described with reference to accompanying drawings, wherein similar constituent elements are designated by similar reference numerals throughout the drawings for a better understanding of the present invention.

FIG. 1 shows a semiconductor device according to an exemplary embodiment of the present invention. The semiconductor device, generally designated by numeral 10, is configured as a DRAM device, and includes a memory cell array area 10A in which a plurality memory cells are arranged in a two dimensional array, and a peripheral circuit area in which a peripheral circuit for driving the memory cells is disposed. The peripheral circuit area includes a NMOSFET region (NMOS region) 10B and a PMOSFET region (PMOS region) 10C. Two MOSFETs sharing a common source diffused region are depicted in the memory cell array area 10A, whereas a single NMOSFET and a single PMOSFET are depicted in the NMOS region 10B and PMOS region 10C, respectively.

The semiconductor device 10 includes a silicon substrate 11, in the surface portion of which a STI (shallow trench isolation) structure is formed to isolate element forming regions from on another, the element forming regions each receiving therein a MOSFET or MOSFETs. On the silicon substrate 10 is formed a gate insulation film 14, on which a gate electrode 15 and a top protective film 16 are consecutively formed. The gate electrode 15 has a poly-metal structure, including a bottom polysilicon layer, or silicon electrode film 17 doped with impurities, and a top tungsten film 18. The silicon electrode film 17 is doped with phosphor as an n-type dopant in the memory cell array area 10A and NMOS region 10B, and doped with boron as a p-type dopant in the PMOS region 10C. The top protective film 16 is configured by a silicon nitride film, for example.

A recess 13 is formed in the element forming regions of the memory cell array area 10A, and the lower part of the silicon electrode film 17 is received in the recess 13 via the gate insulation film 14. Impurities are introduced in the surface regions of the silicon substrate 11 on both the sides of the gate electrode 15 to form source/rain regions 19. The source/drain regions have a p-type in the memory cell array area 10A and NMOS region, whereas the source/drain regions have an n-type in the PMOS region 10C.

The gate electrode 15 and associated sauce/drain regions configure a MOSFET. The MOSFETs formed in the memory cell array area 10A configure recess-type MOSFETs wherein the gate electrode is received in the recess 13, whereas the MOSFETs formed in the NMOS region 10B and PMOS region 10C configure planar MOSFETs wherein the silicon element film 17 is formed on top of the silicon substrate 11.

A portion of the silicon substrate 11 encircling the source/drain regions 19 configures a well 20, which has a conductivity type opposite to the conductivity type of the source/drain regions 19 and an impurity concentration lower than the impurity concentration of the source/drain regions 19. The threshold voltage of the MOSFETs is controlled by controlling the impurity concentration of the well 20.

In the silicon electrode film 17, a crystal grain interface 21 extends uniformly along the surface of the silicon substrate 11. The crystal grain interface 21 is substantially parallel to the surface of the recess 13 within the recess 13. Although not illustrated, a sidewall protective film covers the gate electrode 15 for protection thereof and an interlevel dielectric film is formed on the silicon substrate 11 to cover the top protective film 16 and sidewall protective film. On the interlevel dielectric film are formed overlying interconnections and cell capacitors, which are connected to the source/drain regions 19 and gate electrodes 15 through plugs penetrating the interlevel dielectric film and gate insulation film.

The crystal grain interface 21 extending uniformly within the silicon electrode film 17 diffuses the impurities 34 injected near the top surface of the silicon electrode film 17 toward the bottom of the recess 13 along the crystal grain interface 21. This prevents the insufficient impurity concentration of the silicon electrode film 17 near the bottom of the recess 13, thereby preventing the depletion of the silicon electrode film 17 near the bottom of the recess in operation of the MOSFET and reduction of the operational speed of the DRAM device.

Figure 2A:
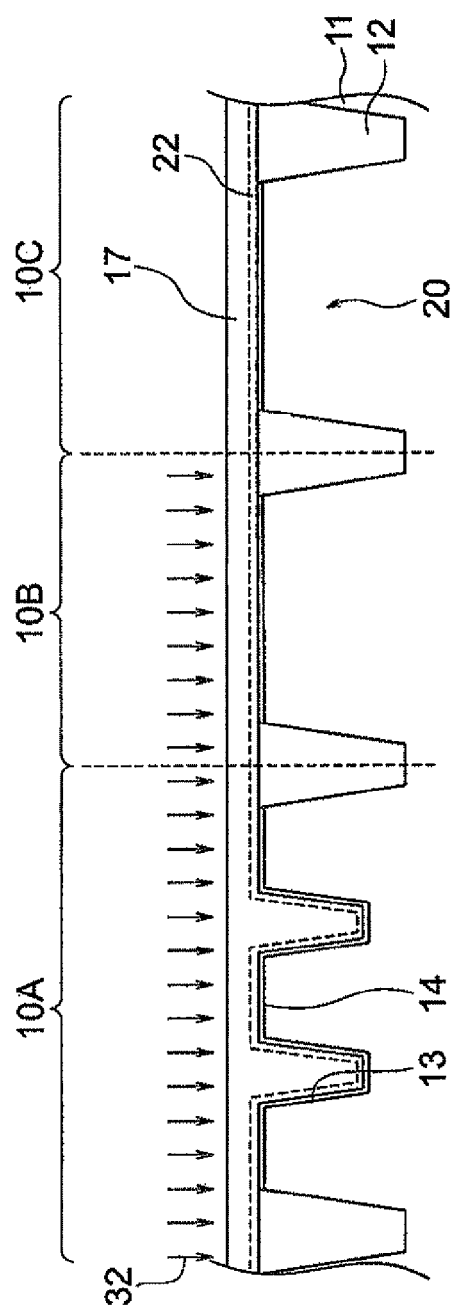
FIGS. 2A to 2C are sectional views of the semiconductor device of FIG. 1 in consecutive steps of a process for manufacturing the semiconductor device according to an exemplary embodiment of the present invention.
Figure 2B:
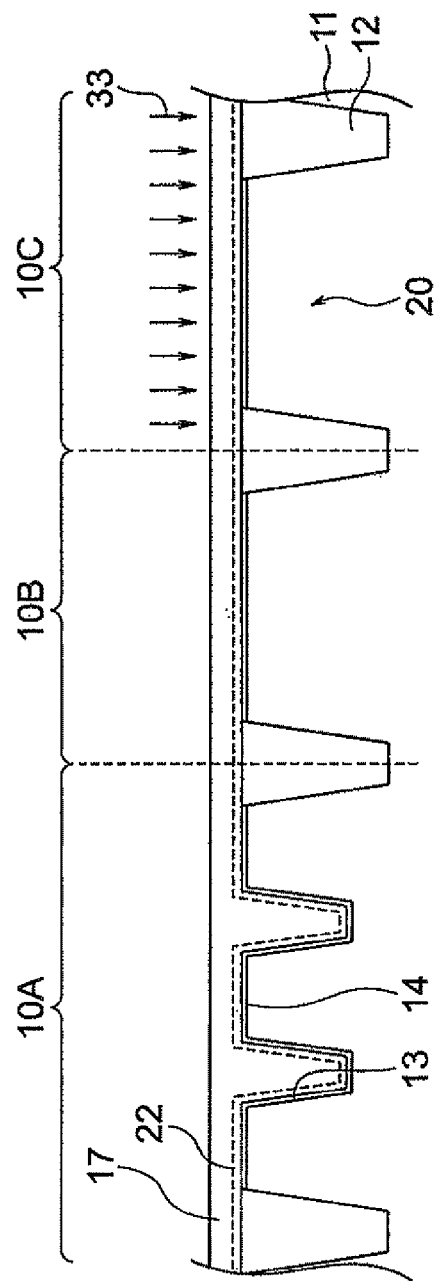
Figure 2C:
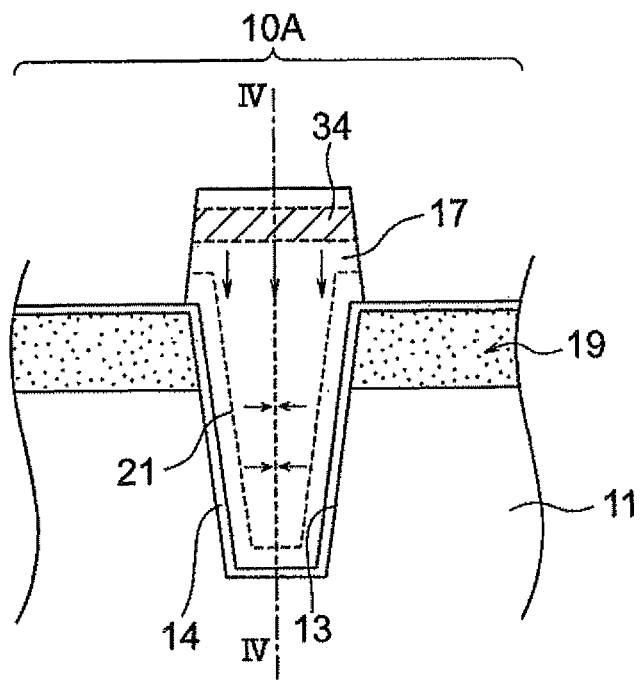

FIGS. 2A to 2C show consecutive steps of a process for manufacturing a semiconductor device according to an exemplary embodiment of the present invention. FIG. 2C shows only the memory cell array area 10A. A STI structure 12 is first formed on the surface region of the silicon substrate 11 to isolate the element forming regions from one another. Subsequently, impurities are introduced into the element forming regions by using a known ion-implantation technique to from therein a well 20. A 150-nm-thick recess 13 is then formed by etching the silicon substrate 11 in the memory cell array area 10A while using a known dry etching technique. The width of the recess 13 may be 60 nm, fore example, which depends on the design rule of the semiconductor device.

After forming a gate insulation film 14 having a thickness of about 6 nm by using a known oxidization technique etc., a non-doped silicon electrode film 17 is deposited to a thickness of 70 nm by using a CVD (chemical vapor deposition) technique. The non-doped silicon film 17 may be an amorphous silicon or a polysilicon film, although the latter is deposited in this example. During the deposition, a minute amount of $O_2$ may introduced in the deposition chamber during a temporary interruption of the deposition The introduced $O_2$ slightly oxidizes the surface of the then-deposited silicon electrode film 17 to form an oxygen-mixed layer 22 thereon. The temporary interruption may be preferably conducted before the deposited silicon electrode film has a thickness equal to or smaller than half the desired minimum width of the recess 13. This allows the oxygen-mixed layer 22 to extend substantially parallel to the surface of the recess 13 and near the bottom the recess 13.

Subsequently, using a known photolithographic and ion-implantation technique, as shown in FIG. 2A, phosphorous ions 32 are injected as an n-type dopant into the silicon electrode film 17 in the memory cell array area 10A as well as in the NMOS area 10B. The dosage of the n-type dopant is $5 \times 10^{15}$ $scm^{-2}$, for example. The acceleration energy in this injection of the n-type dopant is adjusted so that the impurities do not reach the channel region of the silicon substrate 11. The acceleration energy is set at 10 keV or lower for the case of silicon electrode film having a thickness of 70 nm and the n-type dopant being phosphor. The phosphor may be replaced by arsenic.

Thereafter, using a known photolithographic and ion-implantation technique, as shown in FIG. 2B, boron ions 33 are injected as a p-type dopant into the silicon electrode film 17 in the PMOS region 10C. The dosage of the p-type dopant is $2\times10^{15}$ cm$^{-2}$, for example. The acceleration energy in this injection of the p-type dopant is adjusted so that the p-type impurities do not reach the channel region of the silicon substrate 1. The acceleration energy may be preferably set at 5 keV for the case of silicon electrode film 17 having a thickness of 70 nm and the p-type dopant being boron. The boron may be replaced by BF$_2$ or indium.

The ion-implantation shown in FIGS. 2A and 2B may be replaced by in-situ doping wherein the impurities are introduced into the silicon electrode film 17 during deposition thereof. In this technique, if an n-type silicon electrode film is formed in the in-situ doping, conversion of the conductivity type my be necessary in the PMOS region 10C by injecting a p-type dopant into the n-type layer in the PMOS region 10C.

Subsequently, a tungsten film 18 is deposited on the silicon electrode film 17. After depositing, for example, a silicon nitride film on the tungsten film 18, followed by patterning thereof using a known photolithographic and dry etching process to form a top protective film 16. Then, tungsten film 18 and silicon electrode film 17 are patterned to form a gate electrode pattern 15 by using the top protective film 16 as a hard mask.

Subsequently, n-type impurities are injected into the surface region of the silicon substrate 11 exposed from the top protective film 16 in the memory cell array area 10A and NMOS region 10B by using a known photolithographic and ion-implantation technique. Thereafter, p-type impurities are injected into the surface region of the silicon substrate 11 exposed from the top protective film 16 in the PMOS region 10C. The impurities injected in the silicon electrode film 17 and the surface region of the silicon substrate 11 are then diffused by a heat treatment for activation.

The silicon electrode film 17 is re-crystallized during the above heat treatment. The re-crystallization of the silicon electrode film 17 is associated with formation of the crystal grain interface 21, with the oxygen-mixed layer 22 being a boundary in the silicon electrode film 17. The crystal grain interface 21 has a function of diffusing the impurities along the crystal grain interface 21, whereby the phosphorous ions 34 injected near the surface of the silicon electrode film 17 in the memory cell array area 10A are diffused toward the bottom of the silicon electrode film 17 along the crystal grain interlace 21. The thus diffused phosphorous ions are further diffused within the silicon electrode film 17 within the recess 13 from the crystal grain interface 21, as shown in FIG. 2C which shows an enlarged view of a portion of the memory cell array area 10A. The heat treatment also forms the source/drain regions 19 in the surface region of the silicon substrate 11 (FIG. 1).

A sidewall protective film is then formed to cover the sides of the gate electrode 15, followed by deposition of an interlevel dielectric film thereon to cover the top protective film 16 and sidewall protective film. Contact plugs are then formed to penetrate the interlevel dielectric film and gate insulation film 14, connecting to the source/drain regions, followed by forming overlying interconnections and capacitors and completing the semiconductor device.

In the method of the above exemplary embodiment, the oxygen-mixed layer 22 extending parallel to the surface of the recess 13 in the silicon electrode film 17 forms the crystal grain interface 21, with the oxygen-mixed layer 22 being a boundary, during a heat treatment. The oxygen-mixed layer 22 also diffuses the impurities injected near the top surface of the silicon electrode film 17 toward the bottom of the recess 13 along the crystal grain interface 21. This prevents an insufficient impurity concentration in the silicon electrode film near the bottom of the recess 13. The oxygen-mixed layer 22 is formed only by temporarily interrupting the deposition of the silicon electrode film 17 and introducing the oxygen in a minute amount thereof during the temporary interruption, whereby throughput of the process is not substantially lowered.

Although a single crystal grain interface 21 is formed in the silicon electrode film 17 in the above embodiment, two or more crystal grain interfaces 21 may be formed. In this case, the impurities injected near the top surface of the silicon electrode film 17 can be more efficiently diffused toward near the bottom of the recess 13. In addition, although phosphor is used as an n-type dopant introduced into the silicon electrode film 17 in the above embodiment, a similar advantage can be obtained by using arsenic or gallium instead. Similarly, the p-type dopant may be indium or BF$_2$.

Figure 3:
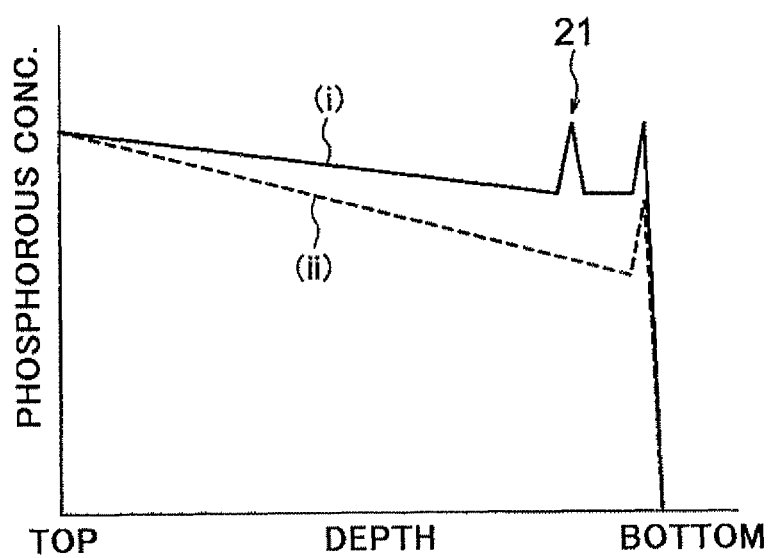
FIG. 3 is a graph sowing the impurity concentration profile along line III-III in FIG. 2C.
Figure 4:
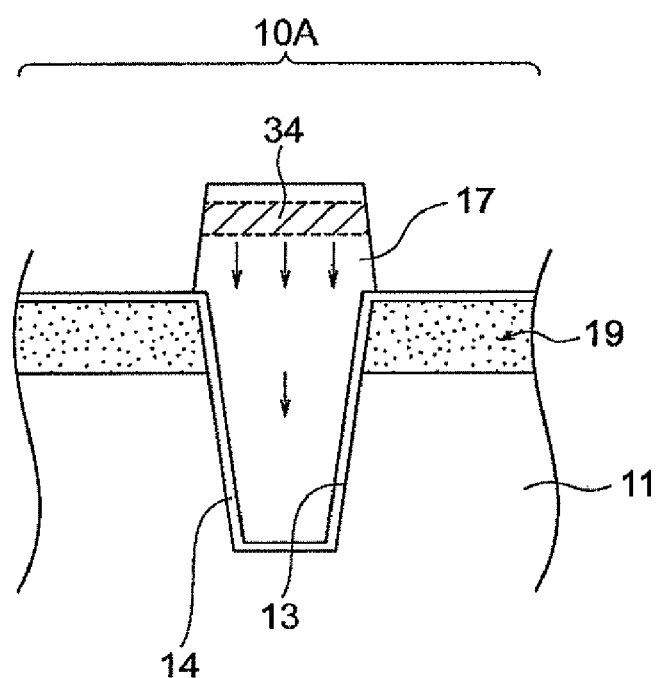
FIG. 4 is a sectional view of a conventional semiconductor device.

The semiconductor device of the embodiment as described above was manufactured to obtain a sample of the embodiment. For comparison therewith, a conventional semiconductor device was also manufactured as a comparative example, which did not have the oxygen-mixed layer. FIG. 3 shows the impurity concentration (phosphor) profile measured for the sample of the embodiment in solid line (i) and for the comparative example in a dotted line (ii).

As understood from this figure, the sample of the embodiment exhibited a larger impurity concentration near the bottom of the silicon electrode film or the bottom of the recess than the comparative example. This assured the advantage of the above embodiment.

In the conventional technique, the silicon electrode film formed in the PMOS region of the peripheral circuit area generally has an n-type conductivity, and the channel of the PMOSFETs is formed within the recess formed in the surface region of the silicon substrate, similarly to that formed in the memory cell array area. This configuration, however, may cause a higher threshold voltage of the MOSFETs due to the difference in the work function between the silicon substrate 11 and the silicon electrode film 17. The recessed-channel PMOSFETs generally have a threshold voltage of around 0.7 volt.

On the other hand, in the exemplary embodiment of the present invention, the silicon electrode film in the PMOS region has a p-type conductivity, and the PMOSFET is of a planar type wherein the channel is formed as a surface channel in the silicon substrate. This configuration reduces the difference in the work function as described above and thus allows the threshold voltage to be reduced down to as low as around 0.3 volt. It is to be noted that an up-to-date logic semiconductor device has a PN-dual-gate structure wherein the silicon electrode film in the PMOS region has a p-type conductivity and the silicon electrode film in the NMOS region has an n-type conductivity, and is manufactured by using a so-called PN-dual-gate process.

As described in the method of the above embodiment the crystal grain interface can be formed during the crystallization of the silicon electrode film with the oxygen-mixed layer being a boundary. Since the impurities injected in the surface region of the silicon electrode film are diffused toward the bottom of the silicon electrode film or bottom of the recess along the crystal grain interface, the depletion of the gate electrode in the vicinity of the bottom of the gate electrode as encountered in the conventional technique can be effectively avoided. The formation of the oxygen-mixed layer is achieved by an temporary interruption of the deposition and providing a minute amount of oxygen onto the surface of the surface of the then-deposited silicon electrode film, whereby the throughput of the process is not substantially lowered.

The impurity-doped silicon electrode film may include any conductivity type. If the silicon electrode film includes an n-type dopant, the n-type dopant may be, for example, phosphor, arsenic or gallium, whereas if the silicon electrode film includes a p-type dopant, the p-type dopant may be, for example, boron, $BF_2$ or indium.

The oxygen-mixed layer may be formed in a single or a plurality of layers in the silicon electrode film.

While the invention has been particularly shown and described with reference to exemplary embodiments thereof the invention is not limited to these embodiments. It will be understood by those of ordinary skill in the art that various changes in form and details may be made therein without departing from the spirit and scope of the present invention as defined in the claims.

What is claimed is:

1. A method for manufacturing a semiconductor device including a recessed-channel MOSFET, comprising:
    forming a recess in a surface region of a semiconductor substrate, said recess having a plurality of surfaces;
    forming a gate insulation film on said plurality of surfaces of said recess;
    forming a silicon electrode on said gate insulation film by forming an oxygen-mixed layer on a first silicon electrode film, said oxygen-mixed layer being substantially parallel to each of said plurality of surfaces of said recess and being covered by a second silicon electrode film to fill said recess;
    injecting impurities in said second silicon electrode film; and
    heat-treating said first and second silicon electrode film to diffuse said impurities.

2. The method according to claim 1, wherein a distance between said surface of said recess and said oxygen-mixed layer is equal to or less than half a minimum width of said recess.

3. The method according to claim 1, wherein said impurities are of n-type.

4. The method according to claim 1, wherein said impurities are of p-type.

5. The method according to claim 1, wherein said heat-treating crystallizes said first silicon electrode film and said second silicon electrode film and forms a crystal grain interface, with said oxygen-mixed layer as a boundary.

6. The method according to claim 1, wherein a thickness of said first silicon electrode film is equal to or less than half a minimum width of said recess.

7. The method according to claim 1, wherein a thickness of said oxygen-mixed layer is formed by performing a thermal oxidation of a top surface of said first silicon electrode film.

8. The method according to claim 1, wherein said first silicon electrode film, said oxygen-mixed layer and said second silicon electrode film constitute a silicon electrode.

9. The method according to claim 1, wherein said first and said second silicon electrode films are formed in an amorphous state.

* * * * *